(12) United States Patent
Paek et al.

(10) Patent No.: US 7,446,422 B1
(45) Date of Patent: Nov. 4, 2008

(54) WAFER LEVEL CHIP SCALE PACKAGE AND MANUFACTURING METHOD FOR THE SAME

(75) Inventors: Jong Sik Paek, Seoul (KR); Sung Su Park, Seoul (KR); Seong Min Seo, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 367 days.

(21) Appl. No.: 11/115,579

(22) Filed: Apr. 26, 2005

(51) Int. Cl.
*H01L 29/40* (2006.01)
(52) U.S. Cl. .................................................. 257/779
(58) Field of Classification Search ......... 257/734–738, 257/772–779, 780, E33.056
See application file for complete search history.

(56) References Cited

U.S. PATENT DOCUMENTS

| | | | |
|---|---|---|---|
| 6,400,021 B1 * | 6/2002 | Cho | 257/738 |
| 6,492,198 B2 * | 12/2002 | Hwang | 438/108 |
| 6,689,678 B2 * | 2/2004 | James et al. | 438/612 |
| 6,750,135 B2 * | 6/2004 | Elenius et al. | 438/615 |
| 2004/0245630 A1 * | 12/2004 | Huang et al. | 257/737 |
| 2006/0038291 A1 * | 2/2006 | Chung et al. | 257/738 |
| 2006/0125110 A1 * | 6/2006 | Do et al. | 257/778 |
| 2006/0270108 A1 * | 11/2006 | Farnworth et al. | 438/106 |

* cited by examiner

*Primary Examiner*—Nathan W Ha
(74) *Attorney, Agent, or Firm*—Gunnison, McKay & Hodgson, L.L.P.; Serge J. Hodgson

(57) ABSTRACT

Disclosed are a wafer level chip scale package and a method for manufacturing the same. An RDL is formed on a semiconductor die through a sputtering process, and a UBM is formed on the RDL through an electroplating process by using the RDL as a seed layer. Thus, the RDL sputtering, UBM electroplating, RDL etching and leakage descum processes are carried out only one time, thereby simplifying the structure and manufacturing processes of the package. Since a copper layer of the RDL is formed with a relatively large thickness through the sputtering process, current density is uniformly distributed during the electroplating process, so it is possible to uniformly form the thickness of the UBM by using pure nickel.

7 Claims, 14 Drawing Sheets

RDL sputtering

RDL sputtering

WAFER LEVEL CHIP SCALE PACKAGE AND MANUFACTURING METHOD FOR THE SAME

BACKGROUND OF THE INVENTION

1. Field of the Invention

The present invention relates to a wafer level chip scale package and a manufacturing method for the same.

2. Description of the Related Art

A general tendency of technical development in an electronic industrial field is to reduce a size of an element. In a field of a semiconductor package, it is important to reduce a size of the semiconductor package identical to a size of a semiconductor die.

Recently, the semiconductor package is fabricated from a wafer through Re-Distribution Layer (RDL) and Under Bumped Metal (UBM) techniques. According to the RDL technique, wirings are induced from a plurality of bond pads formed on a semiconductor die to a large-sized pad aligned in a position different from positions of the bonding pads. In addition, UBM means an alloy allowing a solder ball to be easily welded on a large-sized pad. A package fabricated through the above RDL and UBM technique is called "Wafer Level Chip Scale Package (WLCSP)".

The RDL and UBM techniques mainly include a sputtering technique and a plating technique.

According to the sputtering technique, the RDL can be used as the UBM. The sputtering technique is adaptable for fabricating a simple layered structure in a simple manufacturing process. That is, the sputtering technique includes insulative layer coating, align, develop and cure; RDL sputtering; PR coating, align and develop; etching; PR strip; leakage descum; insulative layer coating, align, develop and cure; flux printing; ball drop; reflow processes. Herein, the RDL (or UBM) consists of three layers in which a first layer is an adhesive layer, such as an aluminum layer or a titanium layer, a second layer is a diffusion layer including nickel-vanadium, and a third layer is a solder wetting layer including copper.

However, such a sputtering technique presents a problem in that interfacial bonding strength between copper and the insulative layer is weak. In addition, the sputtering technique represents weak wet-proof and corrosion-proof characteristics due to corrosion of copper. Since copper forms a strong intermetallic compound when it reacts with tin, which is a main component for a solder or a lead-free solder, reliability of the sputtering technique may be lowered.

In order to solve the above problem, a plating technique has been developed. However, the plating technique causes complicated manufacturing processes. That is, the plating technique includes insulative layer coating, align, develop and cure; seed layer sputtering; plating template coating, align and develop; RDL plating; plating template strip; seed layer etching; leakage descum; insulative layer coating, align, develop and cure; seed layer sputtering; plating template coating, align and develop; UBM plating; plating template strip; seed layer etching; leakage descum; flux printing; ball drop; reflow processes. Thus, the plating technique must repeat the seed layer sputtering process and the leakage descum process twice, so that the manufacturing processes are complicated. Herein, the seed layer is formed so as to plate the RDL or UBM. The seed layer is obtained through a sputtering process by using Ti/Cu. The RDL mainly includes Cu having superior electric conductivity, the UBM includes Ni corresponding to a lead-free solder, and a Cu layer is formed on a surface of Ni so as to prevent Ni from being oxidized. Thus, according to the plating technique, although the solder (or lead-free solder) includes a great amount of tin, Ni does not form the strong intermetallic compound, so reliability of the plating technique may be improved. However, as described above, the plating technique causes the complicated processes and must repeat the seed layer sputtering process and the leakage descum process twice, so a manufacturing process may be erroneously missed or unnecessarily added.

SUMMARY OF THE INVENTION

Disclosed are a wafer level chip scale package and a method for manufacturing the same. An RDL is formed on a semiconductor die through a sputtering process, and a UBM is formed on the RDL through an electroplating process by using the RDL as a seed layer. Thus, the RDL sputtering, UBM electroplating, RDL etching and leakage descum processes are carried out only one time, thereby simplifying the structure and manufacturing processes of the package. Since a copper layer of the RDL is formed with a relatively large thickness through the sputtering process, current density is uniformly distributed during the electroplating process, so it is possible to uniformly form the thickness of the UBM by using pure nickel.

The present invention will be more apparent from the following detailed description taken in conjunction with the accompanying drawings.

BRIEF DESCRIPTION OF DRAWINGS

Common reference numerals are used throughout the drawings and the detailed description to indicate the same elements.

DETAILED DESCRIPTION

Figure 1:
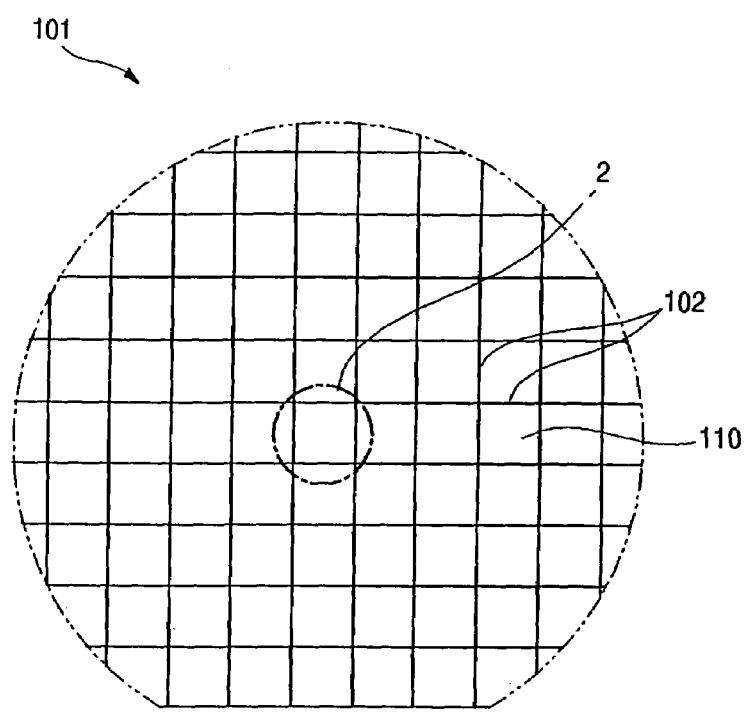
FIG. 1 is a plan view illustrating a wafer used in accordance with the present invention.

FIG. 1 shows a plan view illustrating a wafer 101 used in accordance with the present invention.

As shown in FIG. 1, the wafer 101 used in the present invention has a substantially disc shape. In addition, a plurality of semiconductor dies 110 defined by a plurality of scribe lines 102 are formed on the wafer 101. The wafer 101 is divided into a plurality of semiconductor dies 110 (that is, WLCSP 100) by sawing the wafer 101 along the scribe lines 102 using a sawing device, such as a diamond blade.

Figure 2:
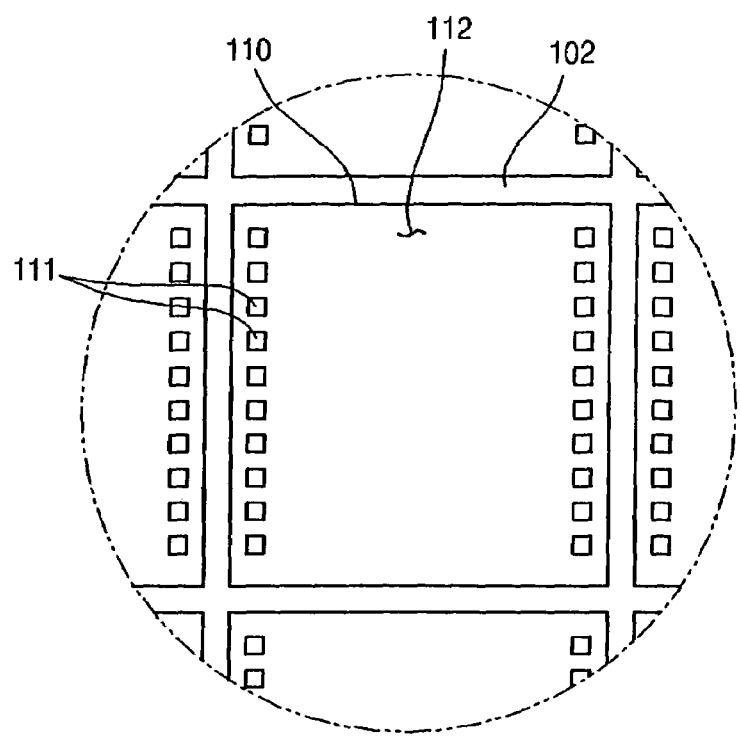
FIG. 2 is an enlarged plan view of an area "2" shown in FIG. 1.

FIG. 2 shows an enlarged plan view of an area "2" shown in FIG. 1.

As shown in FIG. 2, a plurality of bond pads 111 are formed on a surface of the semiconductor die 110. Although FIG. 2 shows the bonds pads 111 aligned along two lateral portions of the semiconductor die 110, it is possible to align the bonds pads 111 along one lateral portion, three lateral portions or four lateral portions of the semiconductor die 110. In addition, the bond pads 111 can be aligned at a central portion of the semiconductor die 110. The whole area of the semiconductor die 110 except for the bond pads 111 may be covered with a passivation layer 112, such as an oxide layer, a nitride layer, or polyimide. In this case, the scribe lines 102 are also formed along four lateral portions of the semiconductor die 110.

Figure 3:
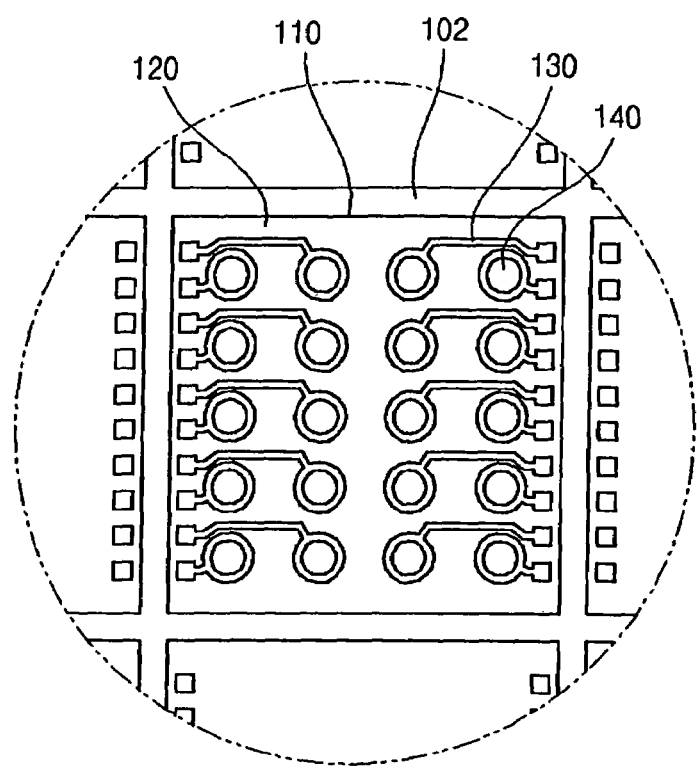
FIG. 3 is a plan view illustrating an RDL and UBM formed on a semiconductor die of a wafer.

FIG. 3 shows a plan view illustrating an RDL and UBM formed on the semiconductor die of the wafer.

One end of the RDL 130 is connected to the bond pad 111, which is not shown in FIG. 3 because the bond pad 111 is aligned below the RDL 130, and the other end of the RDL 130 extends towards a center portion of the semiconductor die 110 so as to be connected with the UBM 140. The UBM 140 is deposited on the RDL 130 with a predetermined thickness. A pattern of the RDL 130 shown in FIG. 3 is only for illustrative purpose and can be modified in various shapes. That is, the present invention does not limit the pattern of the RDL 130. Reference numeral 120 represents the first insulative layer.

Figure 4:
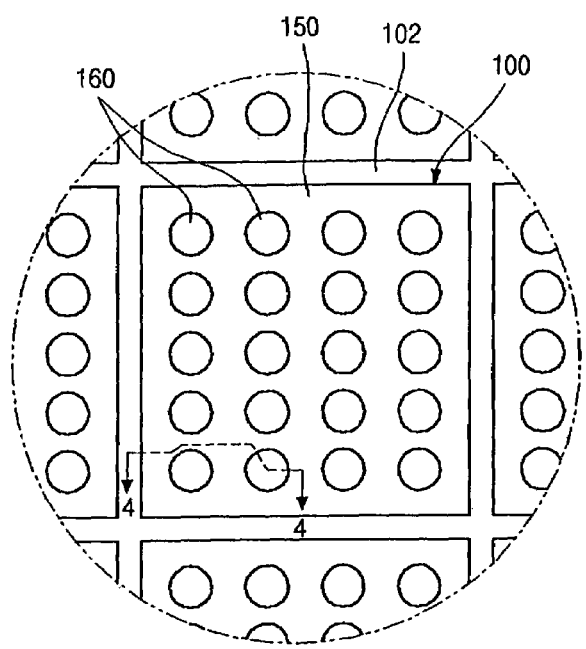
FIG. 4 is a plan view illustrating an insulative layer and a solder ball formed on a wafer after an RDL and UBM are formed on a semiconductor die of the wafer.

FIG. 4 shows a plan view illustrating an insulative layer and a solder ball formed on a wafer after an RDL and UBM are formed on a semiconductor die of the wafer.

The second insulative layer 150 having a predetermined thickness is formed at an uppermost surface of the semiconductor die 110. Solder balls 160 are welded on the UBM 140, which is not shown in FIG. 4 because the UBM 140 is aligned below the solder balls 160. That is, an alignment of peripheral bond pads 111 having a fine pitch is changed into an alignment of area array solder balls 160 having a wide pitch so that the solder balls 160 having a large diameter can be mounted on the UBM 140. After the solder balls 160 have been formed on the UBM 140, a sawing process is carried out along the scribe lines 102 of the wafer 101 so that the wafer 101 is divided into WLCSPs 100.

Figure 5A:
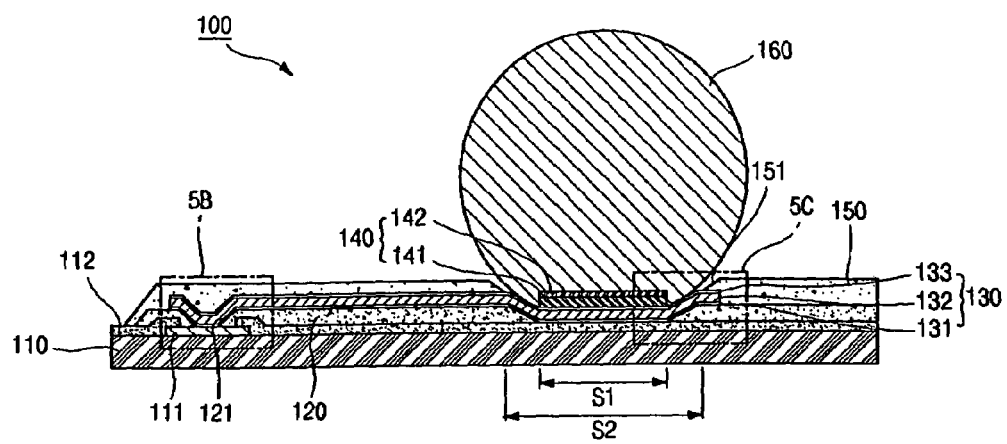
FIG. 5A is a sectional view showing a structure of a WLCSP according to one embodiment of the present invention.
Figure 5B:
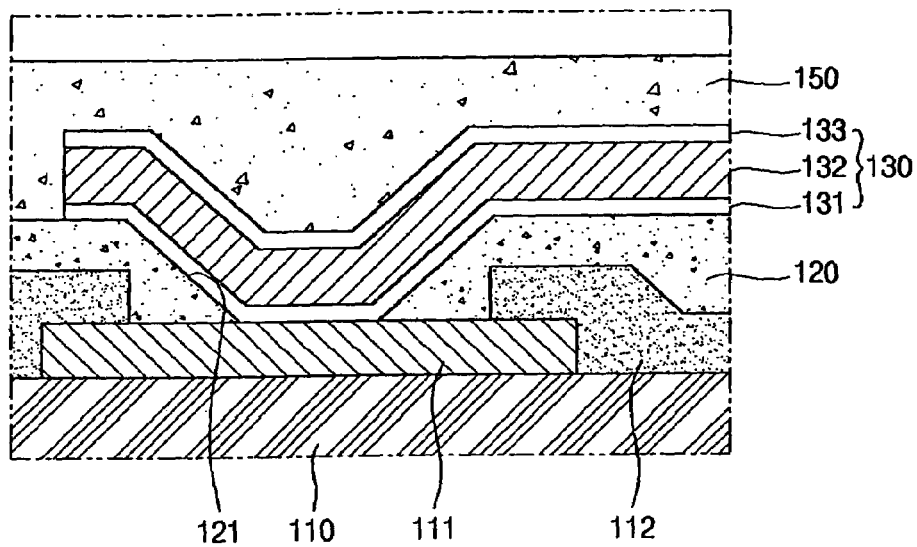
FIG. 5B is an enlarged view of the region "5B" shown in FIG. 5A.
Figure 5C:
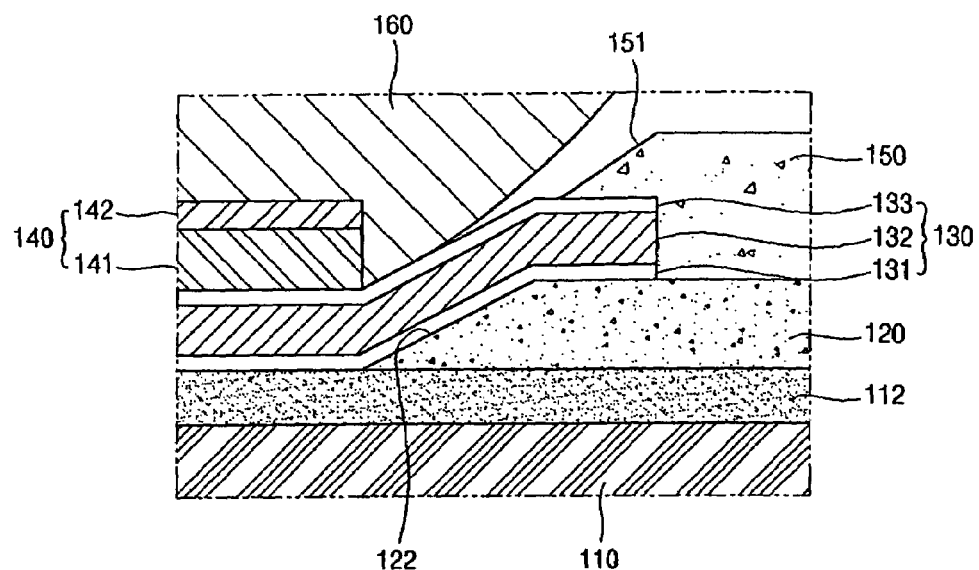
FIG. 5C is an enlarged view of the region "5C" shown in FIG. 5A.

FIG. 5A illustrates a sectional view showing a structure of a WLCSP according to one embodiment of the present invention, FIG. 5B illustrates an enlarged view of the region "5B" shown in FIG. 5A, and FIG. 5C illustrates an enlarged view of the region "5C" shown in FIG. 5A. Herein, FIG. 5A is a sectional view taken along line 4-4 shown in FIG. 4.

As shown in FIGS. 5A to 5C, the WLCSP 100 includes the semiconductor die 110, the first insulative layer 120 formed on the semiconductor die 110, the RDL 130 formed on the first insulative layer 120, the UBM 140 formed on the RDL 130, the second insulative layer 150 formed on the RDL 130, and the solder ball 160 welded to the UBM 140 by passing through the second insulative layer 150.

At least one bond pad 111 is formed on an upper surface of the semiconductor die 110 and a passivation layer 112 having a predetermined thickness is formed at an outer peripheral portion of the bond pad 111. That is, a predetermined portion of the bond pad 111 is upwardly opened through the passivation layer 112. The bond pad 111 is generally made from aluminum. In addition, the passivation layer 112 is made from an oxide layer, a nitride layer or polyimide so as to protect various active regions formed on the semiconductor die 110.

The first insulative layer 120 is formed on the bond pad 111 and the passivation layer 112 with a predetermined thickness. In addition, the first insulative layer 120 is formed with the first opening 121 and the second opening 122, which are upwardly opened. That is, the bond pad 111 is upwardly opened through the first opening 121 and the passivation layer 112 is upwardly opened through the second opening 122. The first opening 121 is spaced from the second opening 122 by a predetermined distance. Herein, the first insulative layer 120 can be formed through coating, align, develop and cure processes. In addition, the first insulative layer 120 is formed by means of one selected from the group consisting of Polybenzoxazoles (PBO), benzocyclobutene (BCB) and equivalents thereof. However, the present invention does not limit materials for the first insulative layer 120.

The RDL 130 has a predetermined length extending from the first opening 121 to the second opening 122. That is, the RDL 130 extends from the bond pad 111 to the passivation layer 112 exposed through the second opening 122. The RDL 130 includes three layers, which are sequentially deposited through a sputtering process. That is, the first layer of the RDL 130 can be obtained by sputtering titanium 131 having a superior adhesive characteristic, the second layer of the RDL 130 can be obtained by sputtering copper 132 having superior electric conductivity, and the third layer of the RDL 130 can be obtained through sputtering titanium 133, which represents a superior adhesive characteristic with respect to the second insulative layer 150 and no-wettability with respect to the solder ball 160.

The UBM 140 is formed on the RDL 130 exposed through the second opening 122 in a predetermined thickness and a predetermined size. The UBM 140 includes a pure nickel layer 141 having a superior adhesive characteristic with respect to a solder or a lead-free solder, that is, a nickel layer which does not contain vanadium. In addition, a Cu layer, a Sn layer or an Au layer 142 can be formed on the pure nickel layer 141 so as to prevent the pure nickel layer 141 from being oxidized. The Cu layer, the Sn layer or the Au layer 142 is completely melted into the solder ball 160 when the solder ball 160 is welded to the UBM 140. In addition, since it is difficult to form the UBM 140 including the pure nickel layer 141 through the conventional sputtering process, the UBM 140 is formed through an electroplating process by using the RDL 130 as a seed layer. Herein, since the UBM 140 uses the RDL 130 having a relatively large thickness as a seed layer, current density is uniformly formed so that the UBM 140 can be uniformly formed with a large thickness.

The second insulative layer 150 is formed on the first insulative layer 120 and the RDL 130 with a predetermined thickness. The second insulative layer 150 can be formed through coating, align, develop and cure processes. In addition, the second insulative layer 150 is formed with the third opening 151 such that the UBM 140 and a part of the RDL 130 in the vicinity of the UBM 140 can be exposed through the third opening 151. In other words, a size S1 of the UBM 140 is smaller than a size S2 of the third opening 151, so the RDL 130 formed between the UBM 140 and the third opening 151 can be upwardly exposed. In the same manner as the first insulative layer, the second insulative layer 150 is formed by means of one selected from the group consisting of Polybenzoxazoles (PBO), benzocyclobutene (BCB) and equivalents thereof. However, the present invention does not limit materials for the second insulative layer 150.

The solder ball 160 is a lead solder or a lead-free solder welded to the UBM 140. Herein, the solder is made from Sn and Pb or Sn, Ag and Cu. However, the present invention does not limit the material for the solder. When the solder ball 160 is welded to the UBM 140, a welding area of the solder ball 160 is naturally defined because the solder ball 160 has no adhesive characteristic with respect to a part of the RDL 130 formed in the vicinity of the UBM 140, that is the third layer 133 made from Ti. That is, the solder ball 160 is not welded to the whole area of the RDL 130 exposed through the third opening 151, but welded only to the UBM 140, so it is possible to precisely control a height and a diameter of the solder ball 160 when the RDL 130 is partially exposed.

Figure 6A:
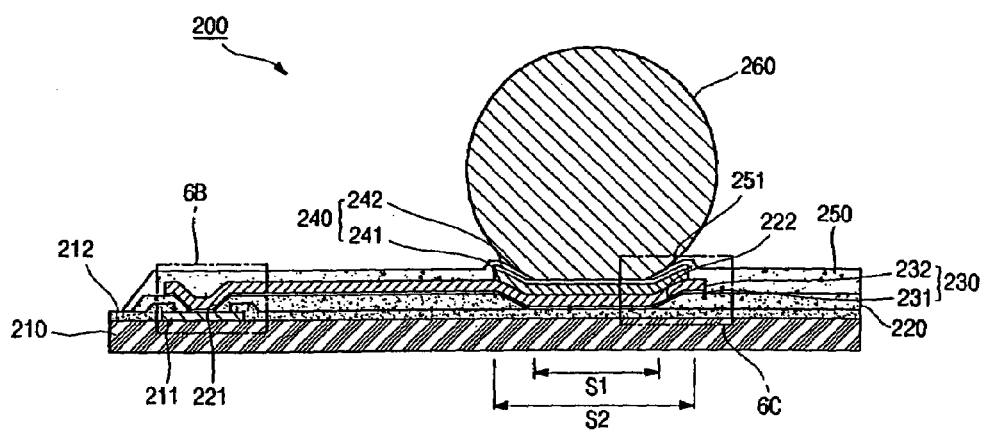
FIG. 6A is a sectional view showing a structure of a WLCSP according to another embodiment of the present invention.
Figure 6B:
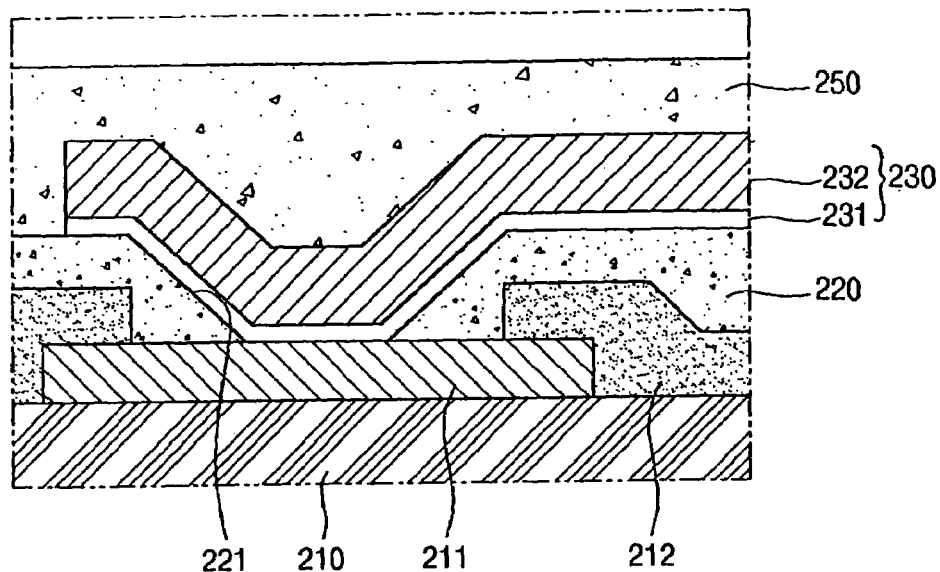
FIG. 6B is an enlarged view of the region "6B" shown in FIG. 6A.
Figure 6C:
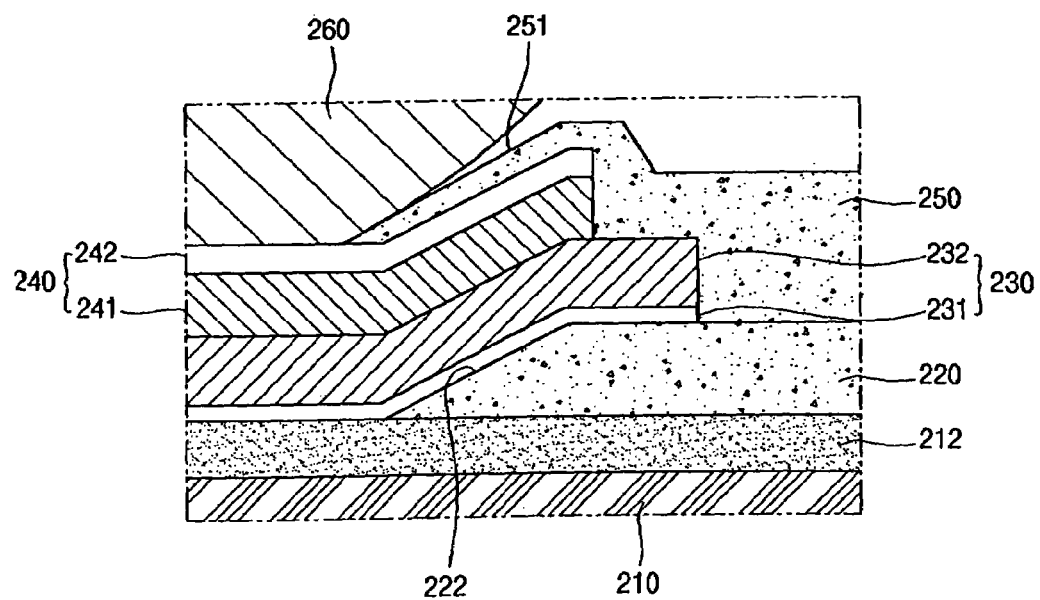
FIG. 6C is an enlarged view of the region "6C" shown in FIG. 6A.

FIG. 6A illustrates a sectional view showing a structure of a WLCSP according to another embodiment of the present invention, FIG. 6B illustrates an enlarged view of the region "6B" shown in FIG. 6A, and FIG. 6C illustrates an enlarged view of the region "6C" shown in FIG. 6A. Herein, FIG. 6A is a sectional view taken along line 4-4 shown in FIG. 4.

As shown in FIGS. 6A to 6C, the WLCSP 200 includes the semiconductor die 210, the first insulative layer 220 formed on the semiconductor die 210, the RDL 230 formed on the first insulative layer 220, the UBM 240 formed on the RDL 230, the second insulative layer 250 formed on the RDL 230 and the UBM 240 while exposing a predetermined region of the UBM 240, and a solder ball 260 welded to the UBM 240 exposed through the second insulative layer 250. The WLCSP 200 according to another embodiment of the present invention has a structure substantially identical to the structure of the WLCSP 100, so the following description will be focused on the difference between the WLCSP 100 and the WLCSP 200. Passivation layer 212, bond pads 211, openings 221, 222 of FIGS. 6A, 6B, and 6C are similar to passivation layer 112, bond pads 111, openings 121, 122 of FIGS. 5A, 5B, and 5C, respectively.

The RDL 230 can be obtained by sequentially sputtering Ti 231 and Cu 232. In addition, the second insulative layer 250 is formed on the Cu layer 232 of the RDL 230. A predetermined portion of the UBM 240 formed on the RDL 230 with a predetermined thickness and a predetermined size is covered with the second insulative layer 250. That is, a size S1 of the third opening 251 formed in the second insulative layer 250 is smaller than a size S2 of the UBM 240. The UBM 240 is formed by plating pure nickel 241. In addition, one selected from the group consisting of Cu, Sn and Ag 242 can be plated on the pure nickel layer 241. In addition, the solder ball 260 is welded to the UBM 240, which is exposed through the third opening 251. Herein, the diameter and size of the solder ball 260 are defined by the third opening 251 of the second insulative layer 250. Therefore, according to the present invention, even if the RDL 230 includes only the Ti layer 231 and the Cu layer 232, the Cu layer 232 is not exposed to an exterior and does not directly react with the solder, so corrosion of Cu does not occur.

Figure 7:
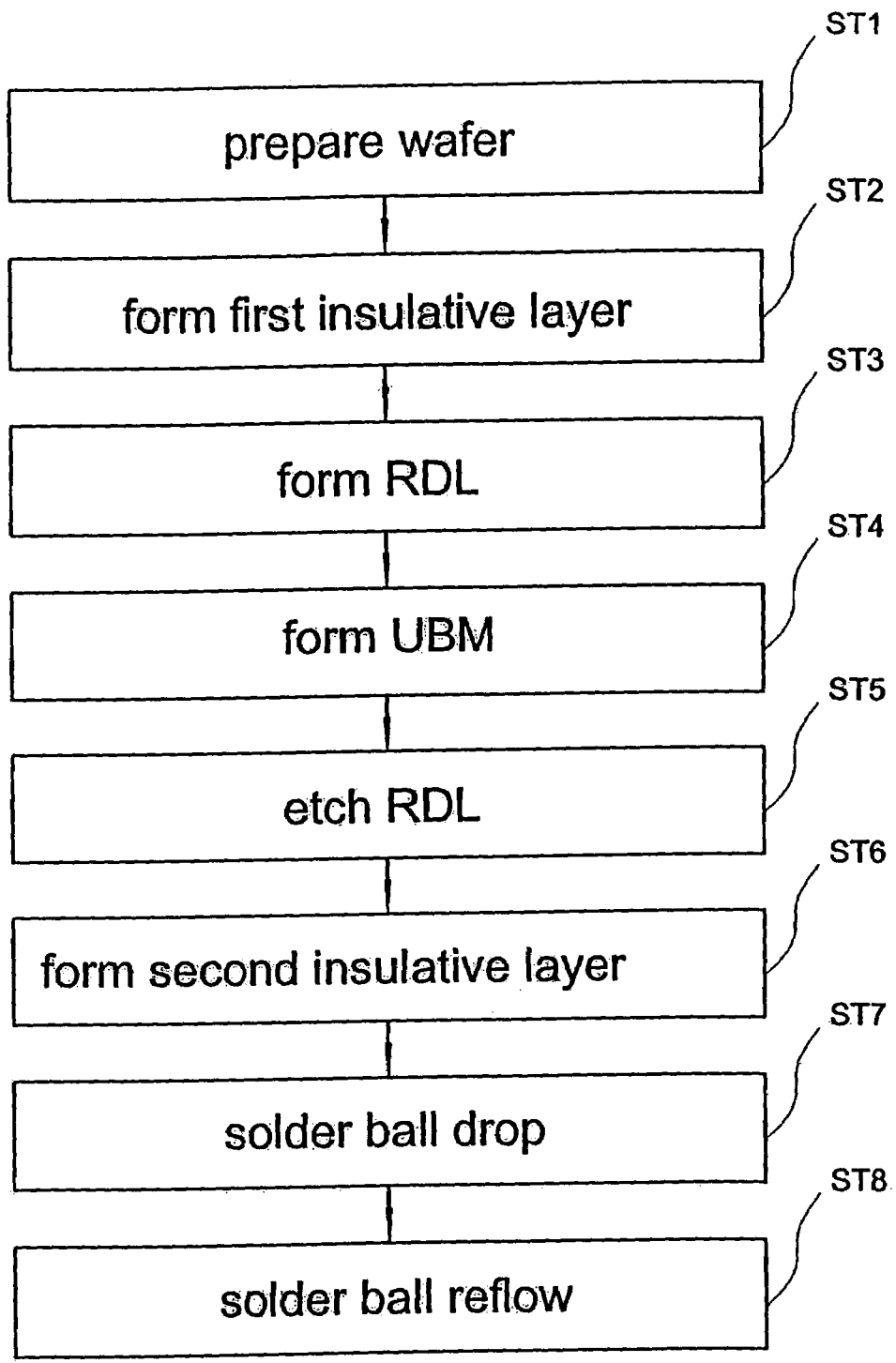
FIG. 7 is a flowchart illustrating a manufacturing process for a WLCSP according to one embodiment of the present invention.

FIG. 7 shows a flowchart illustrating a manufacturing process for a WLCSP according to one embodiment of the present invention.

As shown in FIG. 7, the manufacturing process for the WLCSP according to the present invention includes the operations of preparing the wafer (ST1), forming the first insulative layer (ST2), sputtering the RDL (ST3), plating the UBM (ST4), etching the RDL (ST5), forming the second insulative layer (ST6), dropping the solder ball (ST7) and reflowing the solder ball (ST8).

Therefore, according to the present invention, the RDL is formed through the sputtering process and the UBM is formed through the electroplating process by using the RDL as a seed layer. That is, the present invention performs the sputtering, electroplating and etching processes only one time when fabricating the WLCSP, thereby reducing and simplifying the manufacturing processes for the WLCSP. Hereinafter, the manufacturing processes for the WLCSP according to the present invention will be described in detail.

FIGS. 8A to 8H show sectional views sequentially illustrating the manufacturing process for the WLCSP according to one embodiment of the present invention. Although the manufacturing process of the present invention may be simultaneously applied to a plurality of semiconductor dies formed on the wafer, the manufacturing process of the present invention will be described in relation to a single semiconductor die in order to avoid redundancy. In addition, after fabricating the WLCSP, the wafer is divided into a plurality of packages through a sawing process. However, the sawing process will be omitted below.

Figure 8A:
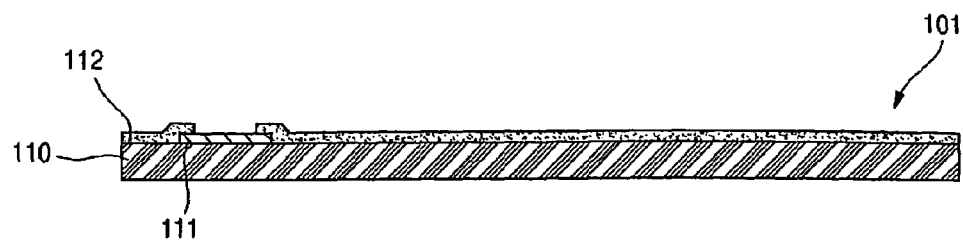
FIGS. 8A to 8H are sectional views sequentially illustrating a manufacturing process for a WLCSP according to one embodiment of the present invention.

First, as shown in FIG. 8A, the wafer 101 including at least one semiconductor die 110 having a bond pad 111, which is exposed through the passivation layer 112, is prepared. Herein, the passivation layer 112 is one selected from the group consisting of an oxide layer, a nitride layer, and polyimide. However, the present invention does not limit the material for the passivation layer 112.

Figure 8B:
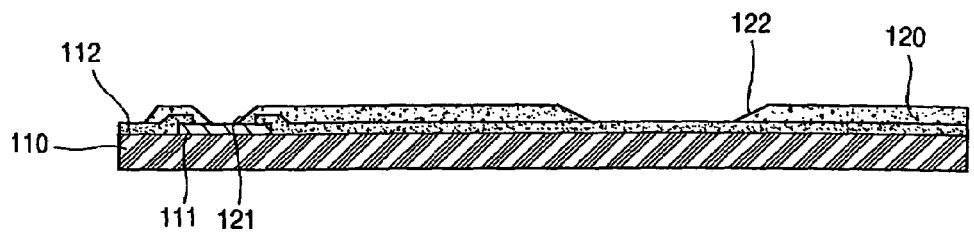

Then, as shown in FIG. 8B, the first insulative layer 120 is formed on the passivation layer 112 in such a manner that the first opening 121 is formed corresponding to the bond pad 111 and the second opening 122 is spaced from the bond pad 111 by a predetermined distance. The first insulative layer 120 is made from PBO or BCB. However, the present invention does not limit the material for the first insulative layer 120. In addition, the first insulative layer 120 can be formed through coating, align, develop and cure processes. The bond pad 111 is upwardly exposed through the first opening 121 of the first insulative layer 120 and a predetermined portion of the passivation layer 112 is upwardly exposed through the second opening 122.

Figure 8C:
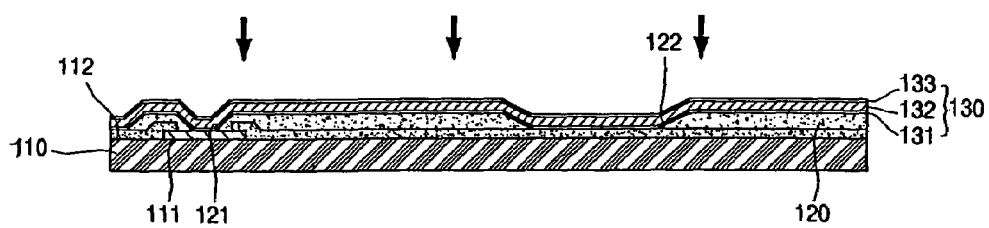

After that, as shown in FIG. 8C, the RDL 130 having a predetermined thickness is formed by sequentially sputtering Ti 131, Cu 132 and Ti 133 on the entire surface of the bond pad 111 exposed through the first opening 121, the passivation layer 112 exposed through the second opening 122 and the first insulative layer 120. Herein, Ti 131 may improve adhesive strength in relation to the first insulative layer 120, Cu 132 facilitates current flow, and Ti 133 may improve adhesive strength in relation to the second insulative layer 150.

Figure 8D:
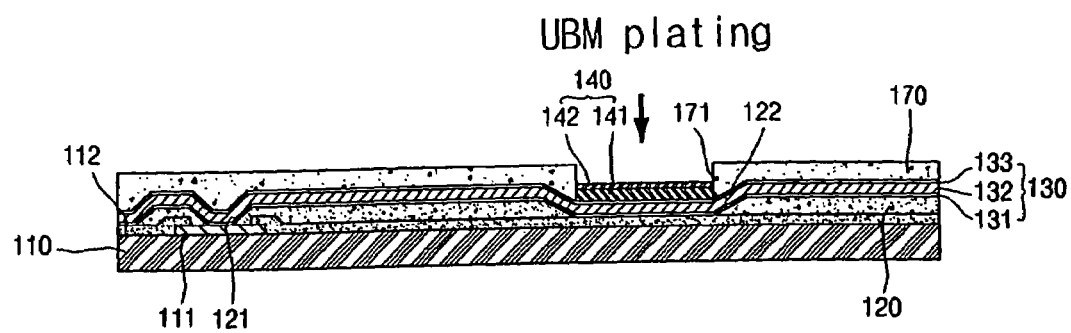

Next, as shown in FIG. 8D, an electroplating process is carried out so as to deposit the pure nickel layer 141 by using a plating template 170 as a mask. At this time, Cu, Sn, or Au 142 can be formed on the pure nickel layer 141 through the electroplating process. According to the present invention, since the RDL 130 acts as a seed layer for the UBM 140, the electroplating process, instead of an electroless plating, can be performed without using a separate seed layer. The plating template 170 can be made from a photoresist film or photoresist liquid.

However, the present invention does not limit the material for the plating template 170. The plating template 170 can be formed through coating, align, develop and cure processes. In addition, the plating template 170 has an opening 171, which is formed in an area corresponding to an area of the UBM 140. After the UBM 140 has been plated, the plating template 170 is stripped.

Figure 8E:
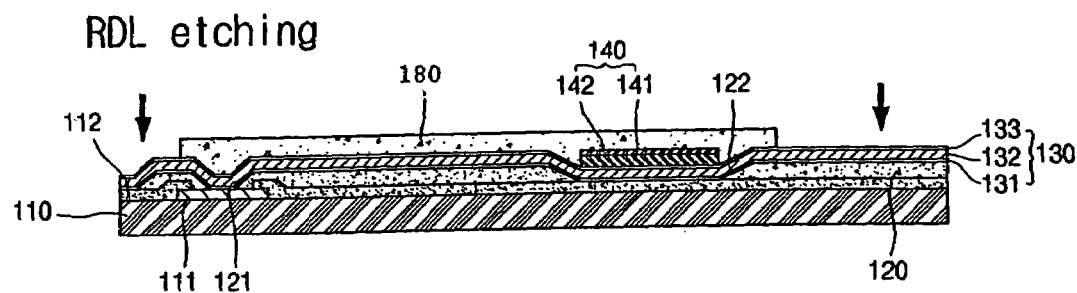

Then, as shown in FIG. 8E, coating, align and develop processes are carried out with respect to a photoresist 180 and the RDL 130 exposed through the photoresist 180 is etched. Therefore, the RDL 130 in the form of an actual wiring is obtained through the above processes. That is, the bond pad 111 is connected to the UBM 140 through at least one wiring. After etching the RDL 130, the photoresist 180 is stripped. In addition, after stripping the photoresist 180, a leakage descum process can be further performed. That is, since residues of RDL 130 may unnecessarily remain on the first insulative layer 120, a surface of the first insulative layer 120 is stripped by using RF plasma.

Figure 8F:
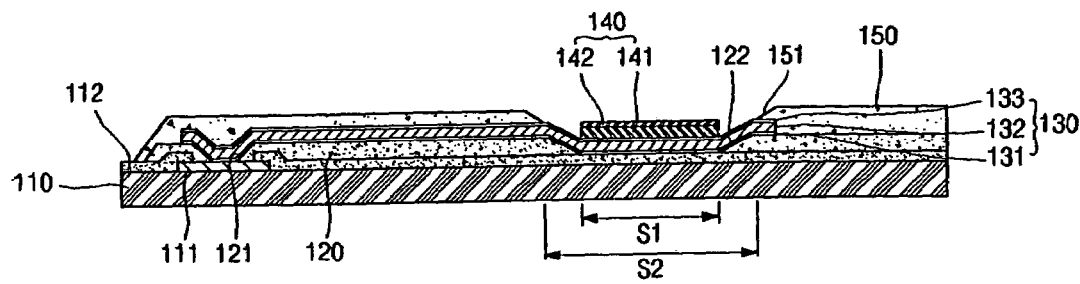

After that, as shown in FIG. 8F, the second insulative layer 150 is formed in such a manner that the third opening 151 is formed in a predetermined region of the second insulative layer 150 corresponding to the UBM 140 and the predetermined portion of the RDL 130 provided in the vicinity of the UBM 140. Herein, the size S2 of the third opening 151 of the second insulative layer 150 is larger than the size S1 of the UBM 140, so the predetermined portion of the RDL 130 formed in the vicinity of the UBM 140 is also upwardly exposed. As described above, the second insulative layer 150 can be made from PBO or BCB. However, the present invention does not limit the material for the second insulative layer 150. In addition, the second insulative layer 150 can be obtained through the coating, align, develop and cure processes.

Figure 8G:
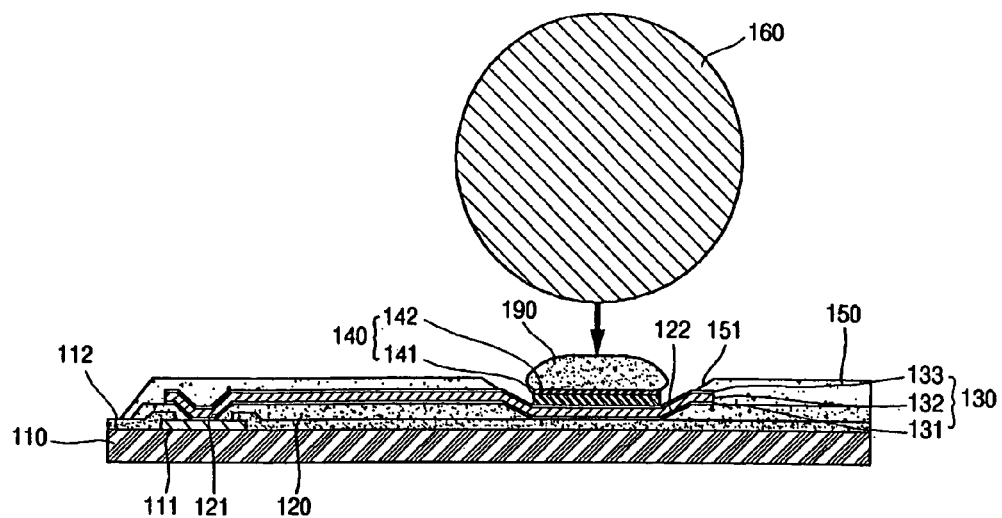

Thereafter, as shown in FIG. 8G, a flux 190 is printed on the UBM 140, which is exposed through the third opening 151 and surrounded by the exposed RDL 130, and the solder is dropped onto the flux 190. The solder may include lead. However, preferably, a lead-free solder including Sn, Ag and Cu is dropped onto the flux 190 for the purpose of the protection of environment. In addition, since the flux 190 has predetermined viscosity, the flux 190 may temporarily fix the solder ball 160.

Figure 8H:
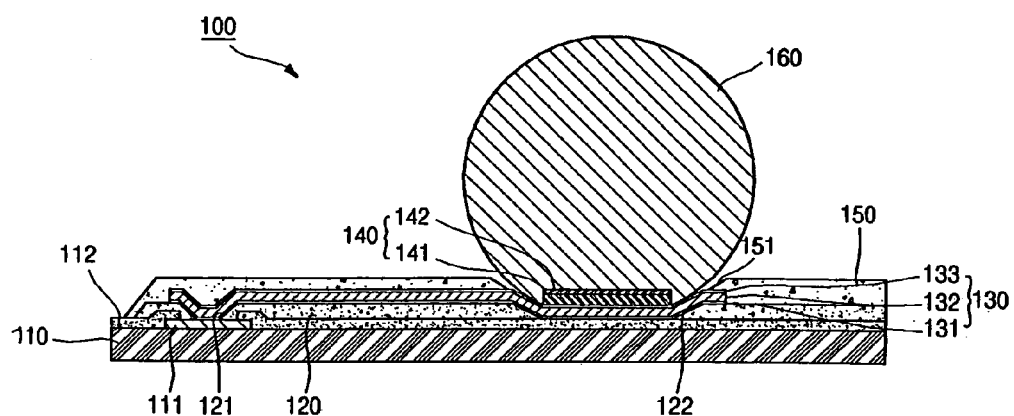

Then, as shown in FIG. 8H, the wafer including the solder ball 160 is inputted into a furnace having a temperature above 180° C., thereby welding the solder ball 160 to the UBM 140. When welding the solder ball 160 to the UBM 140, the flux 190 is completely volatilized. In addition, since the RDL 130 exposed to the exterior is formed with Ti 133, which represents weak wettability with respect to the solder, at an outer peripheral portion of the UBM 140, the welding area, diameter and height of the solder ball 160 can be naturally defined. In other words, after the solder ball 160 has been welded to the UBM 140, the RDL 130 formed in the vicinity of the UBM 140 is exposed to the exterior through the third opening 151. Accordingly, it is possible to precisely control the welding area, diameter and height of the solder ball 160.

FIGS. 9A to 9H show sectional views sequentially illustrating a manufacturing process for a WLCSP 200 according to another embodiment of the present invention.

Figure 9A:
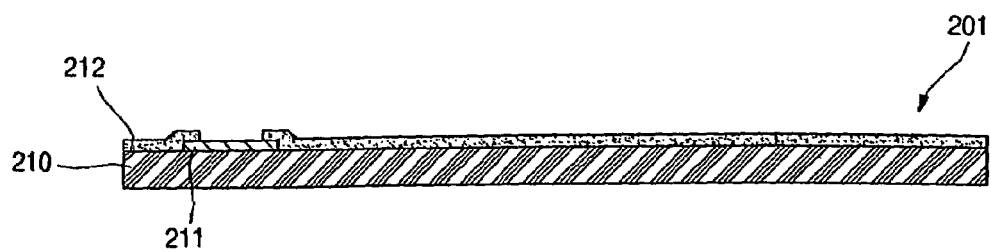
FIGS. 9A to 9H are sectional views sequentially illustrating a manufacturing process for a WLCSP according to another embodiment of the present invention.
Figure 9B:
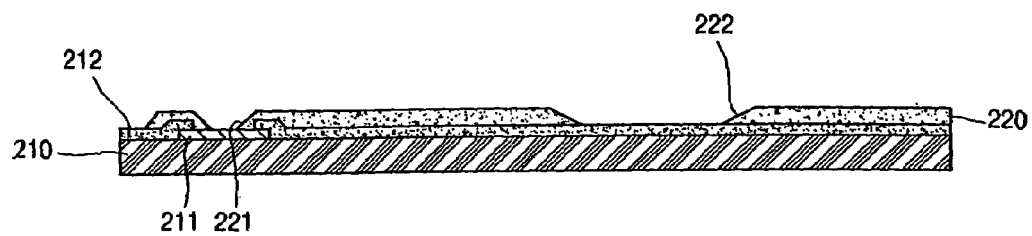

In the manufacturing process for the WLCSP 200 according to another embodiment of the present invention, the operations of preparing a wafer 201 shown in FIG. 9A and forming the first insulative layer 220 shown in FIG. 9B are identical to those of the manufacturing process for the WLCSP 100, so they will not be further described below.

Figure 9C:
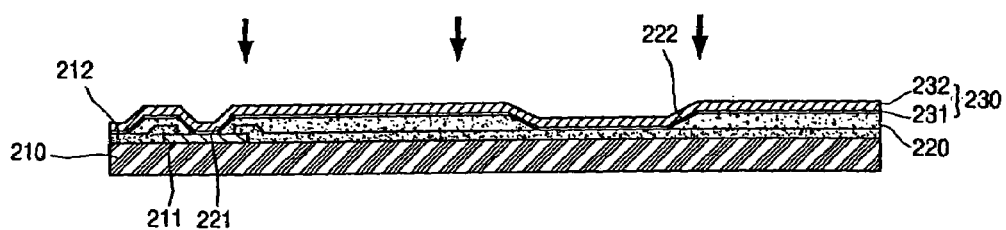

As shown in FIG. 9C, in the RDL sputtering operation, only Ti 231 and Cu 232 are sequentially sputtered. That is, Cu 232 of an RDL 230 does not directly make contact with a solder ball 260 and is mostly covered with a second insulative layer 250 (that is, Cu 232 is not exposed to an exterior), so it is possible to fabricate the RDL 230 in a double-layered structure, instead of a triple-layered structure which is used for the RDL 130 of the WLCSP 100.

Figure 9D:
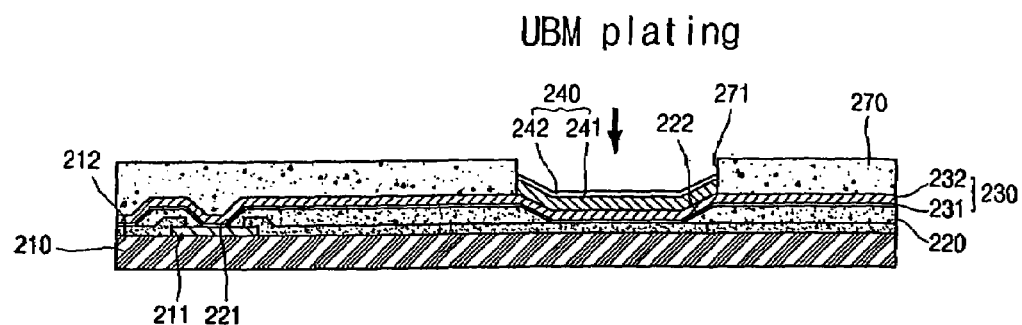

Then, as shown in FIG. 9D, an electroplating process is carried out so as to deposit a pure nickel layer 241 by using a plating template 270 as a mask. At this time, Cu, Sn, or Au 242 can be formed on the pure nickel layer 241 through the electroplating process. The plating template 270 can be made from a photoresist film or photoresist liquid. However, the present invention does not limit the material for the plating template 270. The plating template 270 can be formed through coating, align, develop and cure processes in such a manner that an opening 271 is formed in the plating template 270 corresponding to an area of the UBM 240. Herein, a size of the opening 271 of the plating template 270 is larger than the second opening 222 formed in the first insulative layer 220. In addition, after the UBM 240 has been plated, the plating template 270 is stripped.

Figure 9E:
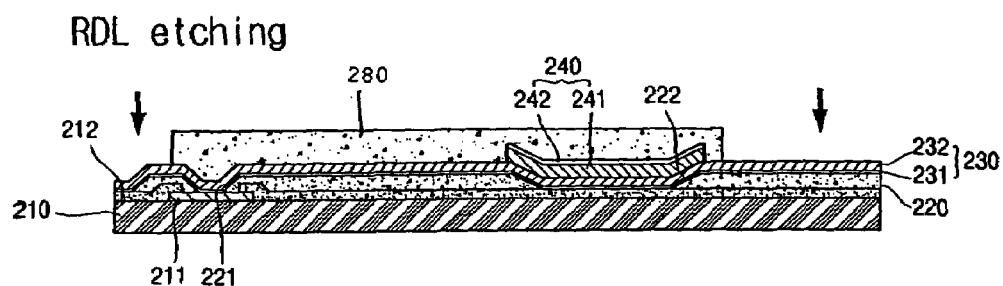

Then, as shown in FIG. 9E, coating, align and develop processes are carried out with respect to a photoresist 280 and the RDL 230 exposed through the photoresist is etched. Therefore, the RDL 230 in the form of an actual wiring is obtained through the above processes. That is, a bond pad 211 is connected to the UBM 240 through at least one wiring. After etching the RDL 230, the photoresist is stripped. In addition, after stripping the photoresist, a leakage descum process can be further performed. That is, since residues of RDL 230 may unnecessarily remain on the first insulative layer 220, a surface of the first insulative layer 220 is stripped by using RF plasma.

Figure 9F:
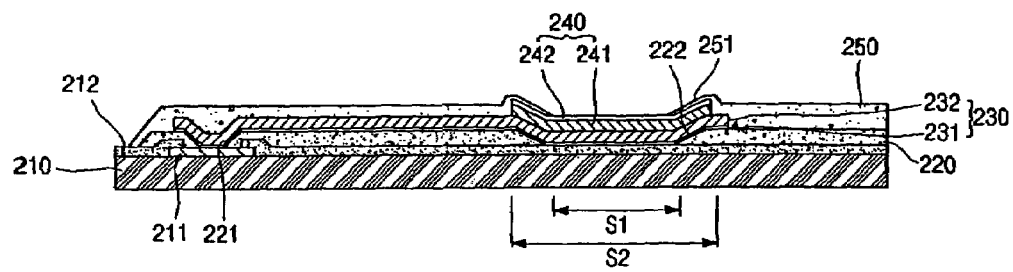

After that, as shown in FIG. 9F, the second insulative layer 250 is formed in such a manner that the third opening 251 is formed corresponding to the UBM 240. Herein, the size S1 of the third opening 251 of the second insulative layer 250 is smaller than the size S2 of the UBM 240. As described above, the second insulative layer 250 can be made from PBO or BCB. However, the present invention does not limit the material for the second insulative layer 250. In addition, the second insulative layer 250 can be obtained through the coating, align, develop and cure processes.

Figure 9G:
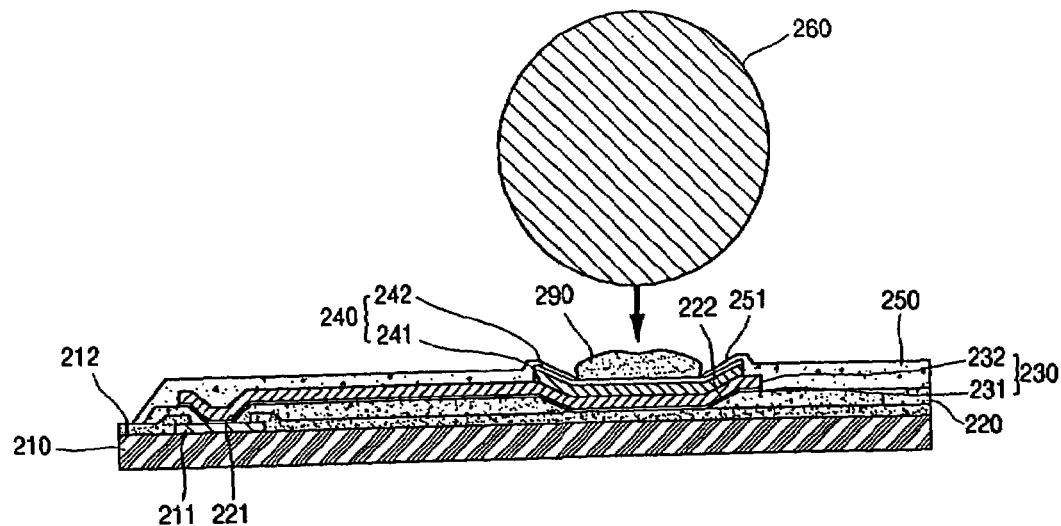

Thereafter, as shown in FIG. 9G, a flux 290 is printed on the UBM 240, which is exposed through the third opening 251 and a solder ball 260 is dropped onto the flux 290. The solder ball 260 may include lead. However, preferably, a lead-free solder ball including Sn, Ag and Cu is dropped onto the flux 290 for the purpose of the protection of environment. The present invention does not limit the material for the solder ball 260. In addition, since the flux 290 has predetermined viscosity, the flux 290 may temporarily fix the solder ball 260.

Figure 9H:
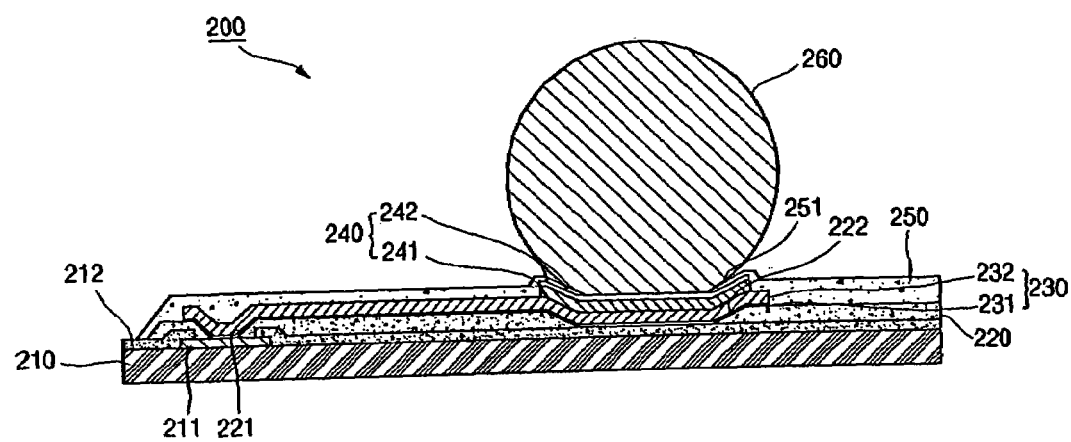

Then, as shown in FIG. 9H, the wafer including the solder ball 260 is inputted into a furnace having a temperature above 180° C., thereby welding the solder ball 260 to the UBM 240. When welding the solder ball 260 to the UBM 240, the flux 290 is completely volatilized. In addition, the third opening 251 of the second insulative layer 250 is formed corresponding to an outer peripheral portion of the UBM 240, so that the welding area, diameter and height of the solder ball 260 can be naturally defined. Of course, the UBM 240 and the RDL 230 are not exposed to the exterior after the solder ball 260 has been welded to the UBM 240. Accordingly, it is possible to precisely control the welding area, diameter and height of the solder ball 160.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A wafer level chip scale package comprising:
    a semiconductor die including at least one bond pad and a passivation layer formed at an outer peripheral portion of the bond pad;

a first insulative layer formed on the passivation layer and having a first opening corresponding to the bond pad and a second opening spaced from the bond pad by a distance;

a re-distribution layer (RDL) formed on the passivation layer so as to connect the first opening to the second opening;

an under bumped metal (UBM) formed on the RDL corresponding to the second opening of the first insulative layer;

a second insulative layer formed on the first insulative layer, the RDL and the UBM and having a third opening, wherein a size of the third opening is less than a size of the UBM such that a portion of the UBM is covered by the second insulative layer; and a solder ball welded to the UBM.

2. The wafer level chip scale package as claimed in claim 1, wherein the RDL includes a titanium layer formed through a sputtering process and a copper layer formed on the titanium layer through the sputtering process.

3. The wafer level chip scale package as claimed in claim 1, wherein the first insulative layer and the second insulative layer are made from an insulative material selected from the group consisting of polybenzoxazoles (PBO) and benzocyclobutene (BCB).

4. The wafer level chip scale package as claimed in claim 1, wherein the UBM includes pure nickel formed through a plating process.

5. The wafer level chip scale package as claimed in claim 4, wherein a metal selected from the group consisting of Cu, Sn and Au is formed on the pure nickel through the plating process.

6. The wafer level chip scale package as claimed in claim 1, wherein a welding area of the solder ball is defined by the second insulative layer formed at an outer portion of the UBM such that the solder ball is welded to the UBM.

7. The wafer level chip scale package as claimed in claim 1, wherein a welding area of the solder ball is smaller than a width of the UBM.

* * * * *